United States Patent
Kruglick

(10) Patent No.: US 11,897,237 B2
(45) Date of Patent: Feb. 13, 2024

(54) GRAPHENE COATED CHAMBER AND FLUID PROCESSING

(71) Applicant: PepsiCo, Inc., Purchase, NY (US)

(72) Inventor: Ezekiel Kruglick, Poway, CA (US)

(73) Assignee: PepsiCo, Inc., Purchase, NY (US)

(*) Notice: Subject to any disclaimer, the term of this patent is extended or adjusted under 35 U.S.C. 154(b) by 353 days.

(21) Appl. No.: 16/639,882

(22) PCT Filed: Aug. 18, 2018

(86) PCT No.: PCT/US2018/047008
§ 371 (c)(1),
(2) Date: Feb. 18, 2020

(87) PCT Pub. No.: WO2019/036693
PCT Pub. Date: Feb. 21, 2019

(65) Prior Publication Data
US 2020/0262174 A1  Aug. 20, 2020

Related U.S. Application Data

(60) Provisional application No. 62/547,566, filed on Aug. 18, 2017.

(51) Int. Cl.
*B32B 3/30* (2006.01)
*A23L 3/00* (2006.01)
(Continued)

(52) U.S. Cl.
CPC ............. *B32B 3/30* (2013.01); *A23L 3/001* (2013.01); *A23L 3/003* (2013.01); *A23L 3/3418* (2013.01);
(Continued)

(58) Field of Classification Search
CPC . B32B 3/30; A23L 3/001; A23L 3/003; A23L 3/34095
(Continued)

(56) References Cited

U.S. PATENT DOCUMENTS 6,389,958 B1 * 5/2002 Ono ..................... A23L 3/10
422/26
2006/0122451 A1   6/2006 Petrik
(Continued)

FOREIGN PATENT DOCUMENTS

| EP | 1 603 662 A1 | 12/2005 |
|---|---|---|
| EP | 3 398 620 A1 | 11/2018 |
| WO | 2015/113575 A1 | 8/2015 |

OTHER PUBLICATIONS

Omid Akhavan et al., Toxicity of Graphene and Graphene Oxide Nanowalls Against Bacteria, ACS NANO, vol. 4, No. 10, Oct. 6, 2010, pp. 5731-5736.
(Continued)

*Primary Examiner* — Tu B Hoang
*Assistant Examiner* — Thomas J Ward
(74) *Attorney, Agent, or Firm* — Barnes & Thornburg LLP; G. Peter Nichols

(57) ABSTRACT

A chamber can be a pathogen control device, which can include a body having at least one internal wall defining an internal chamber, and a layer of a two dimensional material on at least a portion of the at least one internal wall. The two-dimensional material can have at least one edge protruding from the at least one internal wall. A pathogen control system can include the chamber and at least one pressure source operably coupled with an inlet of the internal chamber, and optionally include a depressurization vessel. A method of processing a fluid, such as for controlling pathogens, can include providing the chamber, and flowing a fluid with or without pressurized carbon dioxide or processing fluid through the internal chamber of the chamber to contact an edge of the two-dimensional material. The flow through the chamber can be conducted until at least one pathogen is controlled.

17 Claims, 6 Drawing Sheets

(51) Int. Cl.
  *A23L 3/3409* (2006.01)
  *A23L 3/3418* (2006.01)
  *B32B 3/02* (2006.01)
  *C23C 16/26* (2006.01)
  *A23L 3/3598* (2006.01)
  *A23L 2/02* (2006.01)

(52) U.S. Cl.
  CPC ......... *A23L 3/34095* (2013.01); *A23L 3/3598* (2013.01); *B32B 3/02* (2013.01); *C23C 16/26* (2013.01); *A23L 2/02* (2013.01)

(58) Field of Classification Search
  USPC ................. 426/419; 435/289.1; 99/69.12
  See application file for complete search history.

(56) References Cited

U.S. PATENT DOCUMENTS

| | | | |
|---|---|---|---|
| 2008/0041791 A1* | 2/2008 | Cooper | B01J 20/28033 210/695 |
| 2012/0118175 A1 | 5/2012 | Garwood | |
| 2013/0034898 A1* | 2/2013 | Berry | A61L 27/18 435/289.1 |
| 2015/0360954 A1* | 12/2015 | Davis | H01L 21/02263 427/275 |
| 2016/0319431 A1 | 11/2016 | Won et al. | |
| 2017/0051246 A1* | 2/2017 | Galliher | B01J 19/006 |

OTHER PUBLICATIONS

European Search Report issued in corresponding application No. EP18846466, dated Jul. 12, 2021.
Chen, J., et al., "Graphene oxide exhibits broadspectrum antimicrobial activity against bacterial phytopathogens and fungal conidia by intertwining and membrane perturbation," Nanoscale, vol. 6, pp. 1879-1889 (2014).
Damar, S., and Balaban, M.O., "Review of Dense Phase CO2 Technology: Microbial and Enzyme Inactivation, and Effects on Food Quality," Journal of Food Science, vol. 71, No. 1, pp. R1-R11 (Jan. 2006).
Fan, X., et al., "Deoxygenation of Exfoliated Graphite Oxide under Alkaline Conditions: A Green Route to Graphene Preparation," Advanced materials, vol. 20, Issue 23, pp. 4490-4493 (Oct. 6, 2008).
International Search Report and Written Opinion for International Application No. PCT/US2018/047008 dated Dec. 20, 2018, pp. 15.
Ishikawa, H., et al., "Sterilization of microorganisms by the supercritical carbon dioxide micro-bubble method," Bioscience, Biotechnology, and Biochemistry, vol. 59, Issue 10, pp. 1949-1950 (1995).
Lukowiak, A., et al., "Antimicrobial graphene family materials: Progress, advances, hopes and fears," Advances in Colloid and Interface Science, vol. 236, pp. 101-112 (Oct. 2016).
Mattevi, C., et al., "A Review of Chemical Vapour Deposition of Graphene on Copper," Journal of Materials Chemistry, vol. 21, Issue 10, pp. 3324-3334 (Feb. 2011).
Perreault, F., et al., "Antimicrobial Properties of Graphene Oxide Nanosheets: Why Size Matters," ACS Nano, vol. 9, No. 7, pp. 7226-7236 (Jul. 28, 2015).
Pham, V.T.H., et al., "Graphene Induces Formation of Pores That Kill Spherical and Rod-Shaped bacteria," ACS Nano, vol. 9, Issue 8, pp. 8458-8467 (Aug. 25, 2015).
Pu, N-W., et al., "Production of Few-layer Graphene by Supercritical CO2 Exfoliation of Graphite," Materials Letters, vol. 63, Issue 23, pp. 1987-1989 (Sep. 30, 2009).
Santos, C.M., et al., "Graphene nanocomposite for biomedical applications: fabrication, antimicrobial and cytotoxic investigations," Nanotechnology, vol. 23, No. 39, pp. 395101-1-395101-10 (Oct. 2012).
Zhao, C., et al., "Large-area chemical vapor deposition-grown monolayer graphene-wrapped silver nanowires for broad-spectrum and robust antimicrobial coating," Nano Research, vol. 9, No. 4, pp. 963-973 (Apr. 2016).

* cited by examiner

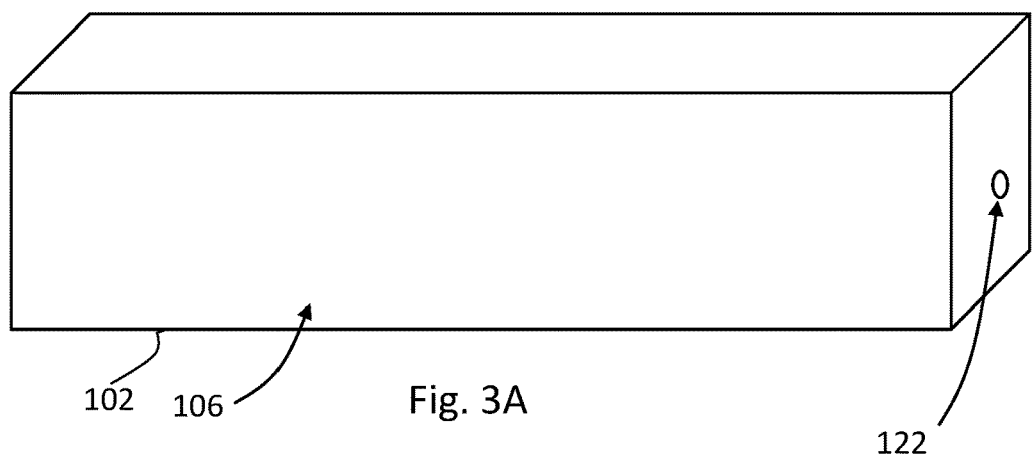
102  106        Fig. 3A
122
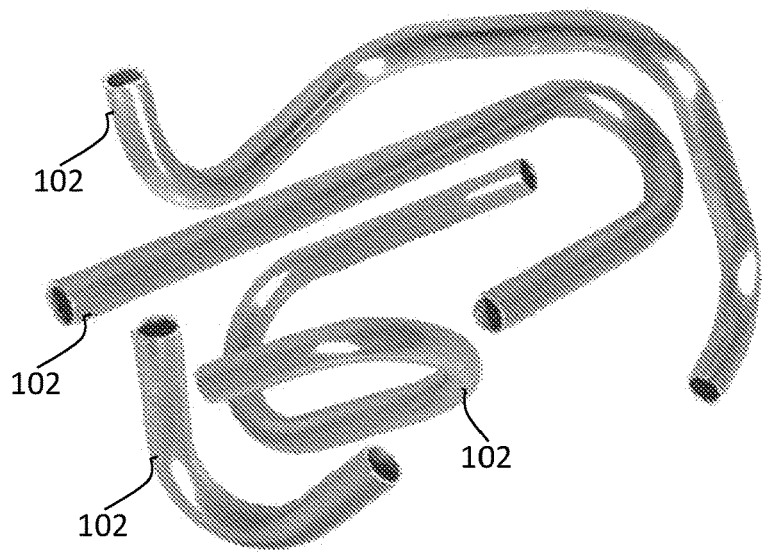
102
102
102
102
Fig. 3B
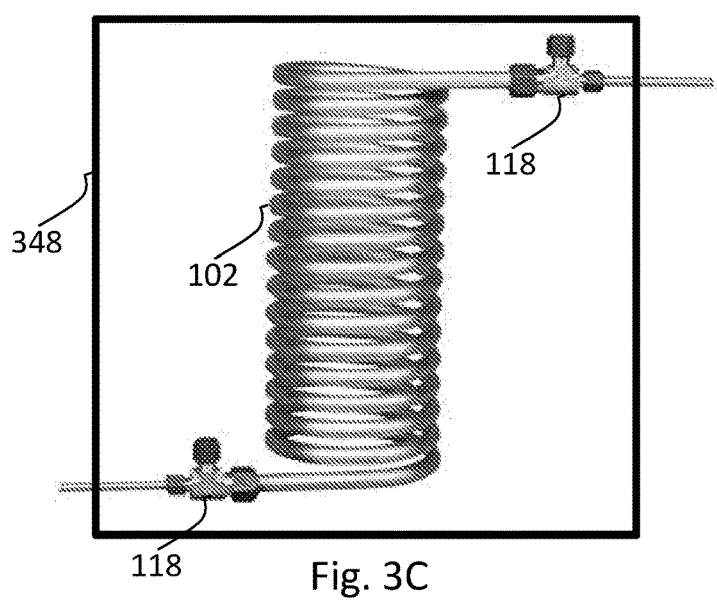
118
348
102
118   Fig. 3C

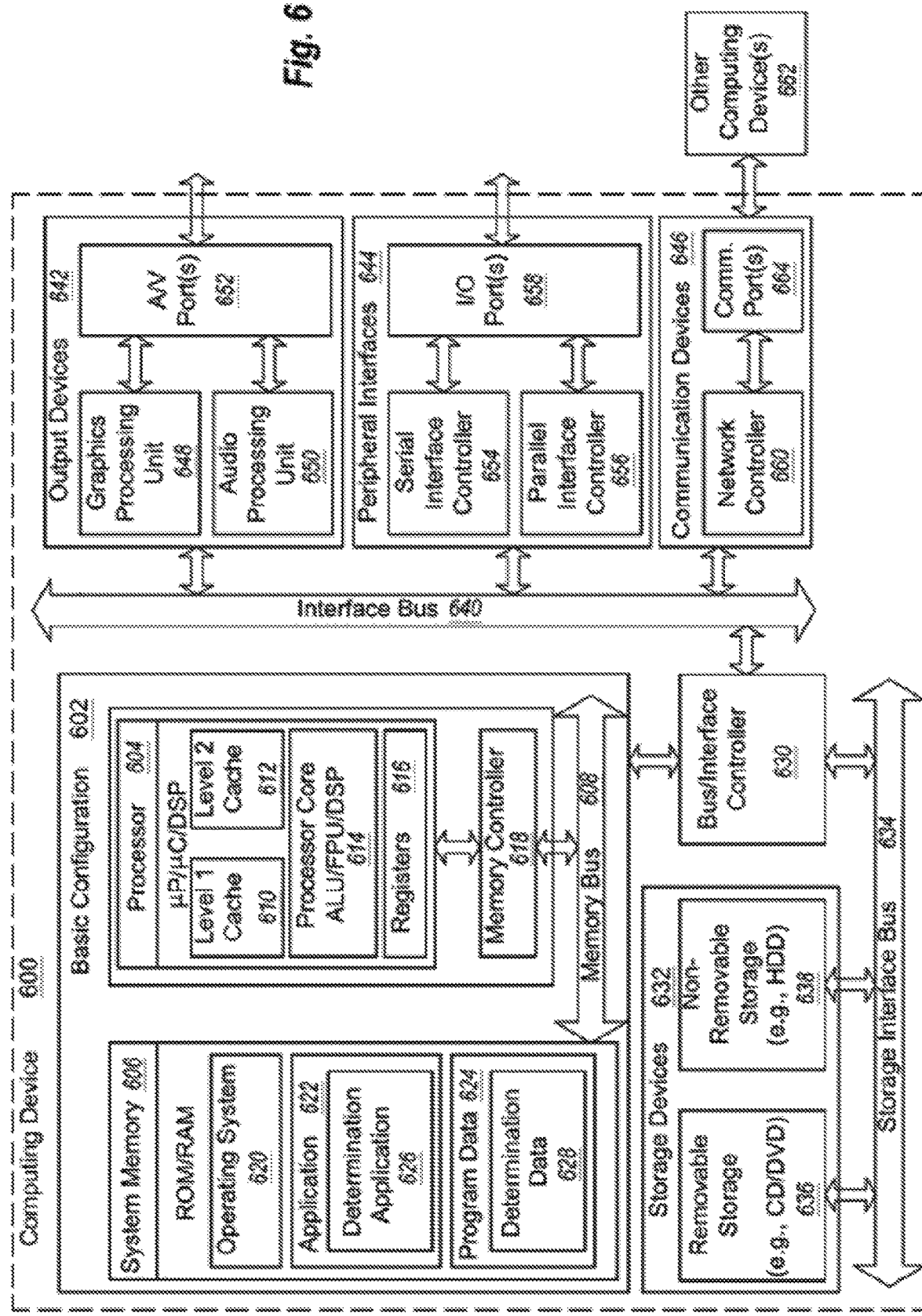

GRAPHENE COATED CHAMBER AND FLUID PROCESSING

CROSS-REFERENCE

This patent application is a § 371 nationalization of PCT Application No. PCT/US2018/047008 filed Aug. 18, 2018, which claims priority to U.S. Provisional Application No. 62/547,566 filed Aug. 18, 2017, which applications are incorporated herein by specific reference in their entirety.

BACKGROUND

Unless otherwise indicated herein, the materials described in this section are not prior art to the claims in this application and are not admitted to be prior art by inclusion in this section.

Processing fluids to control pathogens can be implemented in a variety of media, including air and comestible liquids. Often, such fluids are processed in a manner that reduces the number of viable pathogens. High efficiency particulate absorber (HEPA) filters are often used to remove pathogens from air, but do not kill or deactivate the pathogens that are not removed. Pasteurization is an example of a process to remove pathogens to produce comestible liquids. However, traditional pasteurization may require significantly elevated temperatures and/or pressures, and as a result may compromise the integrity or nutritional benefit of the comestible liquid, such as juices.

Recently, dense phase carbon dioxide (DPCD), which is pressurized carbon dioxide under particular conditions, has been implemented to process comestible liquids without the high temperatures required for traditional pasteurization. A DPCD process may be performed at lower temperatures than traditional pasteurization. Also, carbon dioxide is nontoxic, safe, chemically inert, and is an ingredient in carbonated beverages. Accordingly, DPCD processing may be advantageous for processing beverages to control pathogens. However, industrial scale DPCD processing of beverages may be inhibited by requiring long dwell times in order to control a suitable amount of pathogens.

SUMMARY

In one embodiment, a device (e.g., chamber having a two-dimensional material, such as graphene-coated chamber) can include a body having at least one internal wall defining an internal chamber, and at least one layer of a two-dimensional material (e.g., graphene layer) on at least a portion of the at least one internal wall. The two-dimensional material may be in a layer (e.g., graphene layer), such as at least one flake (e.g., at least one graphene flake) with at least one two-dimensional edge (e.g., graphene edge) protruding from the at least one internal wall.

In one embodiment, a pathogen control system can include the device with at least a portion of a wall of an internal chamber having one or more layers of a two-dimensional material (e.g., graphene), and at least one pressure source (e.g., pressurizing pump, pre-pressurized tank or other pressurized container) operably coupled with an inlet of the internal chamber.

In one embodiment, a pathogen control system can include at least one pressure source operably coupled with the at least one chamber inlet, and a depressurization vessel operably coupled with the chamber outlet.

In one embodiment, a method of controlling pathogens can include providing the chamber with graphene on an internal chamber wall of one of the embodiments or pathogen control system of one of the embodiments, and flowing a combination of a material and pressurized carbon dioxide through the internal chamber until at least one pathogen is controlled (e.g., at least a log reduction, such as 3, 6, or 12 log reductions in pathogens in the material). The number of pathogens in the material can be determined before the processing and in the material after the processing in order to determine whether or not the process controlled the pathogens.

In one embodiment, a method of processing a fluid can include providing the chamber with graphene on an internal chamber wall of one of the embodiments or pathogen control system of one of the embodiments, and flowing a combination of a fluid and pressurized carbon dioxide through the internal chamber.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information, as well as other features of this disclosure, will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 3A-3C illustrate embodiments of chambers of graphene-coated chambers.

FIG. 6 illustrates an embodiment of a controller for a pathogen control system, which is configured as a computer.

Figure 1:
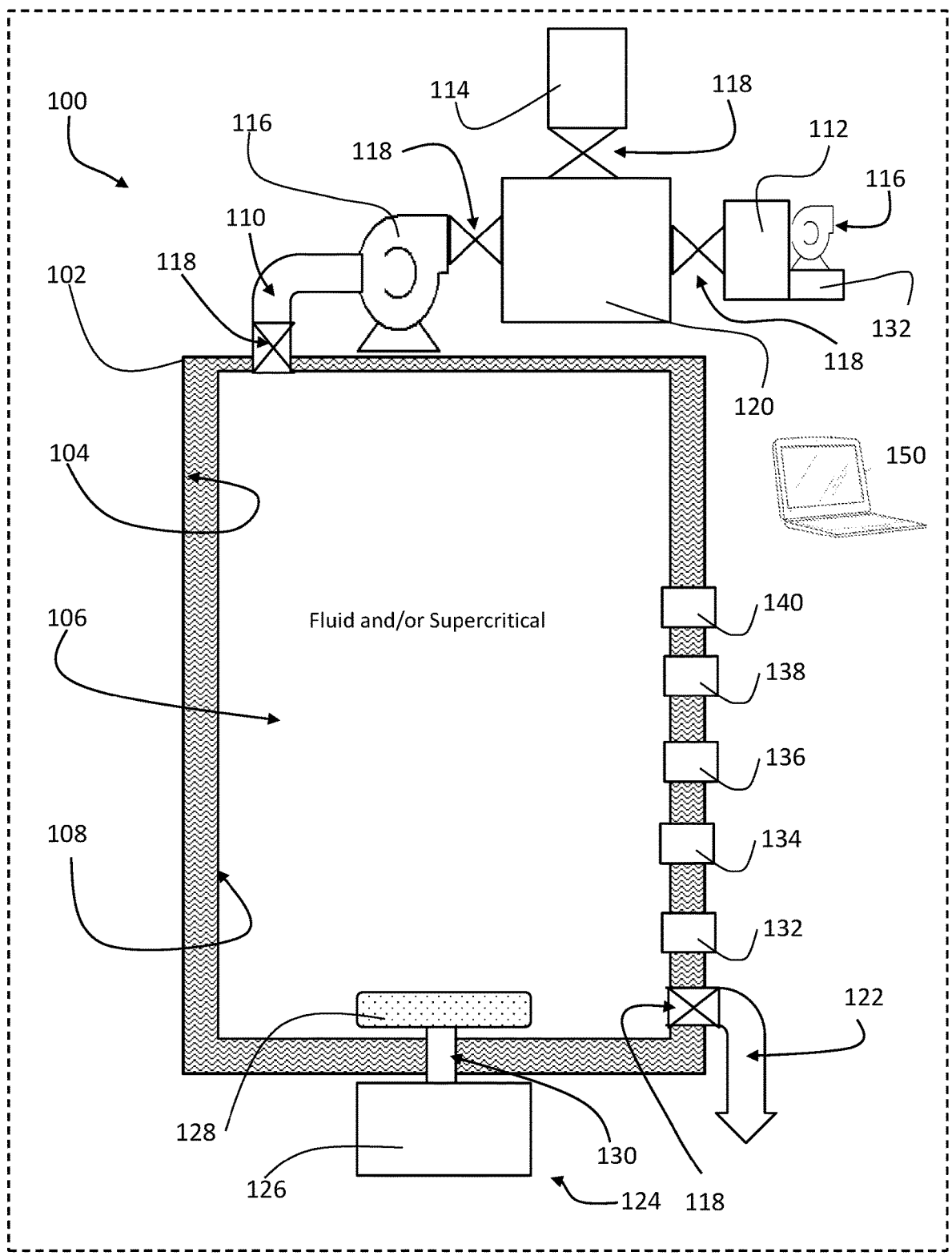
FIG. 1 illustrates an embodiment of a graphene-coated chamber.

The embodiments illustrated in the drawings are arranged in accordance with at least one of the embodiments described herein, and which arrangement may be modified in accordance with the disclosure provided herein by one of ordinary skill in the art.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present technology relates to a device having a chamber that includes internal walls with one or more regions having one or more graphene layers deposited thereon. The deposited graphene layers may be formed as graphene flakes that have graphene edges protruding from the internal walls of the chamber. The chamber having the graphene layers can be used for receiving flowable solids (e.g., particulates, powders, or the like, which are fluidic and capable of flow, and thereby considered to be fluids herein), fluids or other materials (e.g., foodstuff) that may include pathogens so that the graphene edges can penetrate into the pathogens in order to control the pathogens by killing or deactivating the pathogen. Accordingly, the chamber can be used in pathogen control devices and systems, and can be employed in methods of processing solids (e.g., flowable powders etc.), fluids or other materials. The processing of fluids with the graphene-coated chamber may also be performed in pathogen controlling methods.

While the present technology is described herein in connection to graphene layers, the devices, systems, and methods may also use other two-dimensional materials in addition to or in place of the graphene layers, where the two-dimensional materials may be in layers or flakes that have edges that may be shape similarly to the edges of graphene layers/flakes. That is, two dimensional materials, such as graphene, graphene-oxide, dichalcogenides, xenes including silicene and germanene, boron nitride, stanene, or other two-dimensional materials, may be applied to an inner wall of a chamber of the devices and systems described herein and used for the methods described herein. Accordingly, reference to graphene, such as in graphene layers or graphene flakes, may also be considered to reference these two-dimensional materials and other suitable two-dimensional materials, such as in one or more layers of two-dimensional materials or flakes prepared from two-dimensional materials.

The two-dimensional materials, such as graphene, graphene-oxide, dichalcogenides, xenes including silicene and germanene, boron nitride, stanene, or other two-dimensional materials are described to be present in one or more layers. These materials are considered to be two-dimensional materials because they are predisposed to forming layers having a single atom thickness. Two-dimensional materials as described can take on three dimensional overall shapes as the "two-dimensional" layers or sheets of atoms may bend, fold, fracture, or in other ways contribute to an overall three dimensional shape. Collections of such shapes based on two-dimensional materials likewise may take on any three dimensional shape while still being constructed of the two-dimensional layers described. As such, while the material is described as being a "two-dimensional material" based on the single atom thickness, which is a term used in the art, it should be understood that only a single layer is considered to be "two-dimensional" and that two or more layers of such a "two dimensional material" may be used that may or may not form three dimensional structures, whether the structure is a coating, flake, or other. These two-dimensional materials may be crystalline materials that can range from a single layer of atoms to two or more layers of atoms. Accordingly, when the two-dimensional materials are described to be present in one or more layers, such layers are atomic layers that are an atom in thickness. The flakes of such two-dimensional materials may be made from one or more atomic layers. The one or more layers (e.g., atomic layers) of two-dimensional materials may form a coating, which may be in the form of flakes. The coating of one or more layers of two-dimensional materials may only be provided at discrete locations on the chamber internal walls without covering the entirety of the chamber internal wall; however, the entire chamber internal wall may be covered with such a coating of one or more layers of two-dimensional materials. The one or more layers of the two-dimensional materials, or coatings thereof, may be in the form of flakes, which when used herein means that the one or more layers includes an exposed edge of the one or more layers of the two-dimensional materials. That is, a flake includes an exposed edge of the two-dimensional materials, which edge is sharp. In one aspect, the edge of such a flake of a two-dimensional material may be sharp so as to be blade-like and may be capable of cutting, perforating, or otherwise puncturing other materials, such as the outer layer of a pathogen. Using graphene as an example, a single atomic layer of graphene is about 0.35 nm. Other two-dimensional materials may have different atomic layer thicknesses. The thickness of one or more layers in a coating and/or flake of a two-dimensional material can be quite variable. Accordingly, the one or more layers of the two-dimensional materials may range from about 0.35 nm to about 10 nm. In one aspect, the two-dimensional material may be in the form of a coating and/or flake from about 1 nm to about 10 nm, or from about 1 nm to about 1.6 nm, or about 1.6 nm to about 5 nm, or from about 5 nm to 10 nm. Accordingly, coatings and flakes of two-dimensional materials may be varied.

In one embodiment, the chamber having the one or more regions with one or more graphene layers, such as graphene flakes, may be considered to be a graphene coated chamber. However, it should be recognized that the term "graphene coated" does not require the entirety of the chamber walls to be coated, but may include only one or more portions of the chamber internal walls or one or more regions of the chamber internal walls having the one or more graphene layers. In one example, a chamber having one or more graphene layers located on the chamber internal walls may be considered to be a graphene coated chamber because the chamber is at least partially coated with one or more graphene layers. For example, it is not necessary to have a uniform layer of graphene coating a wall of the chamber, but at least a portion of a wall of the chamber has at least one layer of graphene, which graphene may be in the form of a graphene flake that may be attached to the wall in any orientation or angle and may not be flat against the wall. In another example, a graphene coated chamber may include a portion of the chamber internal wall supporting one or more graphene flakes that are oriented at an oblique angle to the chamber internal wall. The graphene flakes need not form a continuous coating. However, in one aspect the chamber internal wall may be fully coated with one or more graphene layers, such as one or more graphene flakes. The graphene layers (e.g., graphene flakes) may be positioned so that a portion or the entirety of the chamber internal wall has graphene thereon. Accordingly, as used herein "graphene-coated chamber" is intended to mean that one or more portions of a chamber internal wall has one or more layers of graphene thereof, which one or more portions may cover any percentage of the chamber internal wall up to fully covering the chamber internal wall, and each portion may have one or more layers of graphene, such as graphene flakes of one or more layers, where at least one graphene edge of a graphene flake is exposed or lifted so as to be capable of slicing or otherwise penetrating into a pathogen. Similarly, the graphene layers, graphene flakes, and graphene edges may be layers of other two-dimensional materials that have edges (e.g., two-dimensional edges or edges made up of one or more layers of two-dimensional materials) that may be in the form of flakes.

The graphene flakes may include graphene layers that are one or more carbon atoms in thickness, which thickness is a dimension that is relatively thin such that the edges of the graphene flakes are sharp. Accordingly, any graphene layer or graphene flake can be a single graphene layer that is only a single carbon atom in thickness, or they can include multiple layers of graphene that are two or more carbon atoms in thickness. As such, the graphene can be present in single graphene layers or multiple graphene layers. The graphene flake may have a least a portion of the flake attached to the chamber internal wall or a layer of graphene may have an exposed surface with a graphene flake thereon with at least a portion of the graphene flake lifted off from the internal wall or graphene layer so that the lifted portion of the graphene flake has an exposed edge. The exposed graphene edges of the graphene flakes may be sharp. The sharp graphene edges can slice or otherwise penetrate into or through an outer layer of a pathogen and compromise the integrity of the pathogen, which results in the pathogen being controlled by being killed or deactivated. Controlling the pathogen can result in a reduced number of viable pathogens. The controlled pathogen is no longer able to function in a pathogenic activity, and may be rendered unable to procreate. Controlling pathogens in fluids with graphene flakes can be useful in a variety of industries and technologies, such as liquid processing and gas processing to remove pathogens.

The graphene-coated chamber can receive a fluid that may include pathogens in a manner such that the pathogens contact the graphene edges, where the graphene edges can penetrate the outer layer of the pathogen resulting in perforations in the pathogen. The perforated pathogen may be controlled by receiving the perforations. Additionally, fluid within the chamber may also enter into the pathogen through the perforations, and the fluid may increase the ability to control the pathogen. For example, if pathogens may be controlled by perforating their outer layer, then the further introduction of the fluid into the pathogen may increase the ability to control more pathogens or control a pathogen more effectively and quickly. Such an increase in control may be determined to provide reductions of viable pathogens in the fluid. The fluid that may or may not have any pathogens can be considered to be the primary fluid that is being processed. While the fluid having the pathogen may pass into the perforations, a secondary fluid that is introduced into the graphene-coated chamber with the fluid having pathogens may further increase the reduction of viable pathogens. The secondary fluid that is used to process the primary fluid may be considered to be a processing fluid. Carbon dioxide is an example of such a processing fluid. However, other processing fluids are described herein, such as in Table 1, which may be used with or without carbon dioxide.

In an embodiment, the secondary fluid may be pressurized carbon dioxide. Accordingly, the graphene-coated chamber may also receive pressurized carbon dioxide along with the fluid that may have the pathogens. The pressurized carbon dioxide may enter into the pathogen through the perforations formed from the graphene edges. This allows for enhanced pathogen control because the perforations may exert a first degree of control and the pressurized carbon dioxide may exert a second degree of control. The combination of perforations and pressurized carbon dioxide may provide superior control over perforations alone and/or pressurized carbon dioxide alone. The graphene-coated chamber may receive the fluid suspected of including pathogens along with the pressurized carbon dioxide as a mixture or receive the fluid and pressurized carbon dioxide separately. The graphene-coated chamber having the fluid suspected of including pathogens and pressurized carbon dioxide may be operated in a manner that encourages any pathogens to contact the graphene edges in order to increase perforations in the pathogens, which in turn increases the amount of pressurized carbon dioxide in the pathogens.

In one embodiment, the carbon dioxide used to control the pathogens can be dense phase carbon dioxide (DPCD), which can be used at a pressure as low as 500 lbs/in2 (3.45 MPa). The use of DPCD for controlling pathogens can be advantageous by being a milder process compared to high pressure pasteurization (HPP), such as by the pressure applied for DPCD (e.g., DPCD having a pressure less than 30 MPa) being lower than the pressure compared to HPP (e.g., pressure at or above 30 MPa). This allows the DPCD to be used for controlling pathogens, and thereby the DPCD may be considered to be a sterilant.

Carbon dioxide, such as pressurized carbon dioxide (e.g., dense phase carbon dioxide (DPCD) or sub-critical carbon dioxide or supercritical carbon dioxide), can be favorably used in processes for controlling pathogens due to being non-toxic, having no special handing and ventilation requirements, being chemically inert (e.g., fairly well tolerated by many polymers), having low or zero surface tension that allows for quick penetration through perforations in a pathogen, being non-flammable, being physiologically safe, being readily available, being easily removed by simple depressurization and out-gassing, being easily controlled, being an ingredient of foods and beverages (carbonated products), and not leaving residues in a treated fluid. Carbon dioxide can be used to control pathogens when internalized due to the chemical reactions that increase the acidity (e.g., reduces pH) within the pathogen, and the increased acidity kills or deactivates the pathogen. Accordingly, the carbon dioxide is used in the processes so that once carbon dioxide enters the pathogen, the carbon dioxide facilitates chemical reactions that increase the acidity (e.g., reduce pH), where the increased acidity compromises the integrity of the pathogen so as to control the pathogen.

In an example, the perforations in the outer layer of the pathogen formed by the graphene edges can allow carbon dioxide (e.g., pressurized carbon dioxide) to migrate into the cytoplasm in an amount sufficient for the carbon dioxide to react with water within the pathogen to form carbonic acid and its conjugate ions. The environment inside of the pathogen (e.g., cytoplasm) can allow for the dissociation of carbonic acid molecules into bicarbonate ions and hydrogen ions. In order to prevent the hydrogen ions from lowering the pH of the cytoplasm, the cell devotes large amounts of energy into pumping the excess hydrogen ions out of the cell. As the influx of the carbon dioxide continues, the cell cannot keep up with the energy requirement for exporting the hydrogen ions, thereby resulting in the accumulation of hydrogen ions and lowering of the pH of the cytoplasm (e.g., acidification), and then resulting in death. Pathogens, such as viruses, may also have chemical reactions with carbon dioxide that acidifies and deactivates the pathogen.

The fluid suspected of having the pathogens may be flowed through the graphene-coated chamber so that the pathogens flow over the graphene flakes and are impaled or sliced by the graphene edges. In one aspect, the graphene-coated chamber may be configured as a vessel having at least one inlet and a means for flowing the fluid within the internal chamber so that the fluid contacts the graphene edges, which may be by stirring, sonication, vibration or other induced turbulence to the fluid within the internal chamber. In one aspect, the graphene-coated chamber may be configured as a fluid pathway having at least one inlet and at least one outlet and a means for flowing the fluid through the internal chamber so that the fluid contacts the graphene edges, which may be by pressurization induced fluid flow as well as gravity induced fluid flow. The devices and systems including the graphene-coated chamber are described herein.

The graphene-coated chamber can be used to control various types of pathogens, with or without the pressurized carbon dioxide. The pathogens can be of any type, where non-limiting examples can include microorganisms, parasites, viruses, or other. Examples of parasites may include nematodes, trematodes, *plasmodium, Trypanosoma brucei,* schistosomes, *Cryptosporidium, Echinococcosis, Cystoisospora belli, Diphyllobothrium, Trypanosoma cruzi* (or other parasitic protozoan), other Trypanosomes (e.g., *Leishmania*), maggots, filarial worms (e.g., *Wuchereria bancrofti, Brugia malayi,* and *Brugia timori*), *Onchocerca volvulus,* amoebas (e.g., *Entamoeba*), *Toxoplasma gondii, Giardia lamblia,* pinworm, or others. The pathogen may also be a bacterium of any type. The pathogen may be a fungi of any type, such as spore, mycelium, or zygote form. The pathogen may also be any type of virus. The pathogens may be controlled by the graphene edges causing perforations in an outer layer of the pathogen and optionally extending through the outer layer of the pathogen into an internal region of the pathogen. The perforations may be caused by at least one graphene edge being inserted at least partially into the pathogen. Also, the pathogen may include the pressurized carbon dioxide in perforations and/or internally within the pathogen. When controlled, the pathogen is dead or deactivated so as to be incapable of living or reproducing, and/or the number of viable pathogens is reduced.

In one embodiment, pressurized carbon dioxide may be used in the graphene-coated chamber in order to control the pathogens. The pressurized carbon dioxide can be at a pressure less than about 30 MPa, between about 3.45 MPa to about 25 MPa, between about 7.4 MPa and 20 MPa or at a pressure above about 1 MPa. However, lower pressures may be used, such as above about 0.25 MPa, above about 0.5 MPa, above 0.75 MPa, or above 1 MPa. The pressurized carbon dioxide is at a temperature greater than about 10° C., greater than about 20° C., greater than about 25° C., greater than or about 29.85° C., between about 10° C. to about 5,000° C., or about 20° C. to about 50° C. However, the pressurized carbon dioxide can be at any temperature to be dense phase carbon dioxide, sub-critical carbon dioxide, or supercritical carbon dioxide. Carbon dioxide is considered to be supercritical when above the critical point, which is above about 31° C. and above about 7.39 MPa. Carbon dioxide is considered to be sub-critical when above 7.39 MPa but below about 31° C. Carbon dioxide is considered to be DPCD when at any temperature in a liquid or gas that is above about 0.5 MPa, preferably above about 1 MPa, and most preferably above about 3.45 MPa. As used herein, pressurized carbon dioxide is in any flowable fluid form, and not a solid. Accordingly, the graphene-coated chamber can be at these pressures and/or temperatures to have pressurized carbon dioxide, and may also include the fluid suspected of having the pathogen.

The fluid can be any type of fluid that may have pathogens, such as liquids (e.g., any liquid) or gasses (e.g., any gas), as well as flowable particles. Liquids can be exemplified by comestible liquids, such as juices or milk, as well as others. Some examples of liquids can include sauces, flavorings, soda, beverages, syrups, sweeteners, beer, liquor, tea, coffee, wine, cream, medicine, oils, milk, soy or other nondairy milk, or the like. The gasses can be any gas ranging from air to purified oxygen, carbon dioxide, nitrogen, or others. The fluids that may have pathogens can be processed with the graphene-coated chamber in order for the pathogens to be controlled.

FIG. 1 shows a graphene-coated chamber 100 having a body 102 with at least one internal wall 104 defining an internal chamber 106. A graphene layer 108 is located on at least a portion of the internal wall 104, one or more separate portions, or over the entirety of the internal wall 104. The graphene layer 108 can include at least one graphene flake with at least one graphene edge protruding from the at least one internal wall 104. A chamber inlet 110 is located in the body 102 and fluidly coupled with the internal chamber 106. The chamber inlet 110 can be used for providing the fluid and/or carbon dioxide (e.g., pressurized carbon dioxide) or other processing fluid into the internal chamber 106. A carbon dioxide reservoir 112 and a fluid reservoir 114 can be fluidly coupled with a pressure source 116 (e.g., pressurizing pump, pre-pressurized tank or other pressurized container) via valves 118 and a mixer 120, and the pressure source 116 is fluidly coupled with the chamber inlet 110. An optional chamber outlet 122 with a valve 118 is also shown that can allow for the contents of the internal chamber 106 to be withdrawn (e.g., to be provided to a depressurizing vessel or storage); however, the chamber outlet 122 is optional because the contents may be withdrawn from the chamber inlet 110 and used as a batch system. The graphene-coated chamber 100 may be used as a continuous or semi-continuous system when the chamber outlet 122 is included.

The graphene-coated chamber 100 is also shown with a mixing mechanism 124 that can be used to agitate the fluid contents of the internal chamber 106. The mixing mechanism 124 can be any device that can cause mixing, turbulence, agitation, or other jostling of the fluid contents so that it flows within the internal chamber 106 and contacts the graphene edges of the graphene layer 108. Examples of a mixing mechanism 124 may include a sonicator, vibrator, shaker, stirrer, mixer, or other similar device capable of mixing fluid. As shown, the mixing mechanism 124 includes a motor 126 that is operably coupled to a mixing bar 128, such as via a spindle 130; however, the coupling may be via magnetics such that the motor 126 and mixing bar 128 are a magnetic mixer. However, any other mixing mechanism 124 may be included.

The graphene-coated chamber 100 can be used by introducing the fluid from the fluid reservoir 114 into the internal chamber 106 via the pressure source 116 and chamber inlet 110, and the mixing mechanism 124 can cause the fluid to flow within the internal chamber 106 and contact the graphene layer 108. The contact with the graphene layer 108 can perforate pathogens in the fluid to control the pathogens. While the process can be performed without pressurized carbon dioxide, using pressurized carbon dioxide from the carbon dioxide reservoir 112 may enhance the ability to control the pathogens more effectively in less time.

In one embodiment, the graphene-coated chamber 100 includes separate chamber inlets 110 for the fluid and carbon dioxide. Also, each chamber inlet 110 may include its own pressure source 116. The carbon dioxide reservoir 112 may also contain pressurized carbon dioxide, and thereby have an optional pressure source 116 and heater 132 associated therewith.

Additionally, FIG. 1 shows a controller 150, which is adapted as a computer. The controller 150 is operably connected to the components of the graphene-coated chamber 100, such as the pressure sources 116, valves 118, mixing mechanism 124, motor 126, and any heaters 132, coolers 134, thermocouples 136, pressure sensors 138, flow rate sensors 140, or other components. The dashed box shows that all of the components can be operably coupled to the controller 150 by wire or wirelessly so that the components can send operational performance data to the controller 150, and the controller 150 can provide operational instruction data to the components. Accordingly, the controller 150 can include a memory device (e.g., non-transitory, tangible) that includes computer executable instructions for receiving operational performance data, computing the operational performance data, determining operational instruction data, and providing the operational instruction data to the components. The components can operate under control of the controller 150 by implementing the operational instructions from the operational data, such as increasing temperature, decreasing temperature, increasing pressure, decreasing pressure, increasing flow rate, decreasing flow rate, or other modulation of operation.

Figure 2:
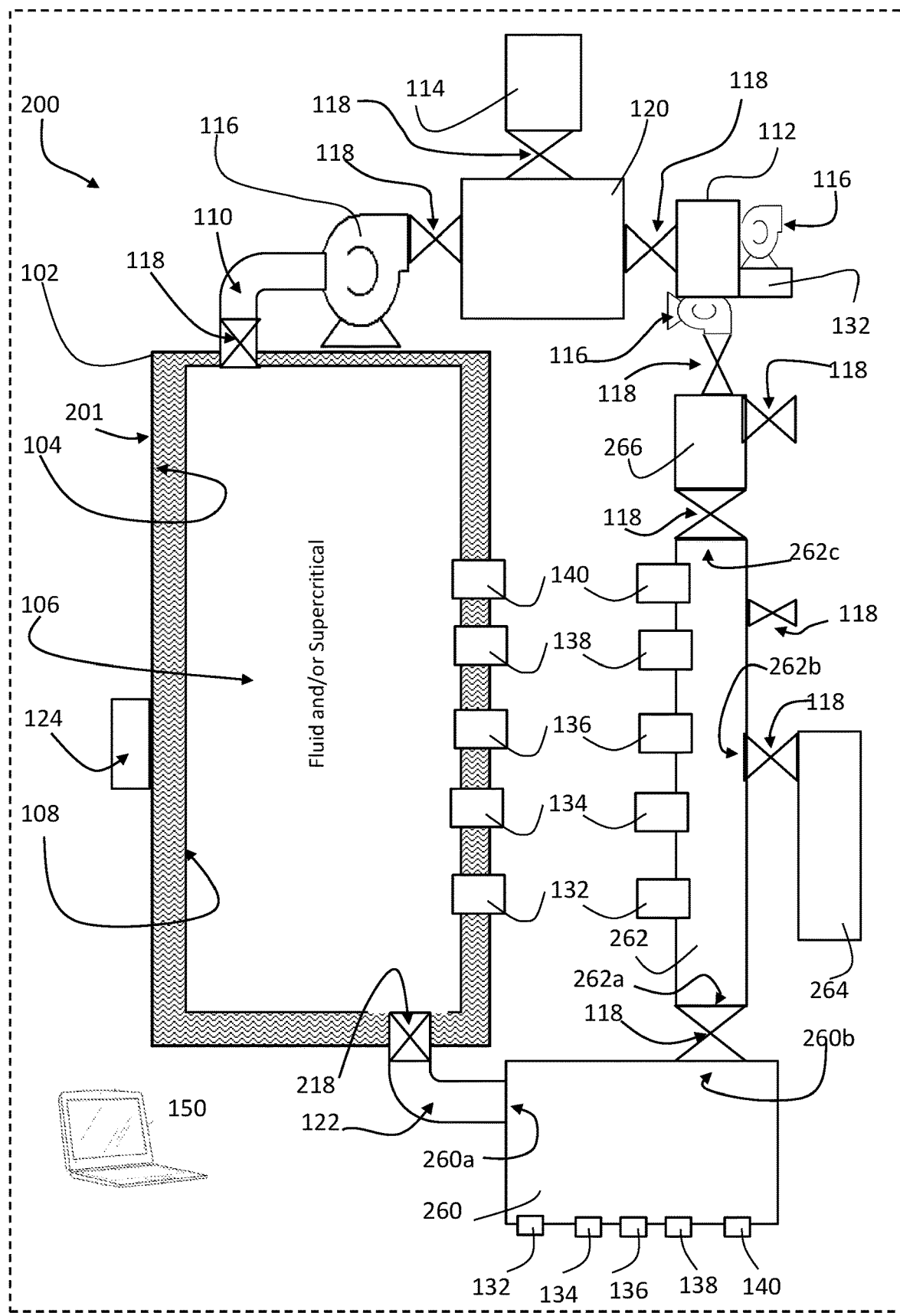
FIG. 2 illustrates an embodiment of a pathogen control system.

FIG. 2 shows a pathogen control system 200 configured as a continuous system by including the chamber outlet 122. The pathogen control system 200 can include the components illustrated and described in connection with the graphene-coated chamber 100 of FIG. 1. The pathogen control system 200 includes the body 102 configured as a graphene-coated chamber 201 that includes the chamber inlet 110 and chamber outlet 122 with the at least one internal wall 104 of the internal chamber 106 therebetween. However, a plurality of chamber inlets 110 and/or chamber outlets 122 may be included. The chamber inlet 110 includes a valve 118 to regulate flow into the internal chamber 106, and the chamber outlet 122 includes an outlet valve 218 to regulate flow out from the internal chamber 106. The outlet valve 218 at the chamber outlet 122 can be an adjustable valve, which can include an adjustable valve member for adjusting a cross-sectional dimension of a flow path through the adjustable valve.

The outlet valve 218 can regulate the dimension of the chamber outlet 122 that is fluidly coupled with an inlet 260a of a depressurization vessel 260. The regulation of the dimension of the chamber outlet 122 by the outlet valve 218 (e.g., under control of the controller 150) can control the depressurization of the pressurized carbon dioxide into gaseous carbon dioxide (e.g., non-pressurized) in the depressurization vessel 260. The depressurization vessel 260 may optionally include heaters 132, coolers 134, thermocouples 136, pressure sensors 138, flow rate sensors 140, or other components, which can be operably coupled with the controller 150. The depressurization vessel 260 can include an outlet 260b that is fluidly coupled to an inlet 262a of a de-gasification vessel 262 through an optional valve 118. In some aspects, the de-gasification vessel 262 can be operated as a separator, which can separate the sample from the gas. In an example, the separator can be configured as a cyclonic sample separator that uses cyclone flow to separate the sample from gas.

The de-gasification vessel 262 can include a fluid outlet 262b that is fluidly coupled with a fluid collection vessel 264 through an optional valve 118. The de-gasification vessel 262 may include a de-gasification outlet 262c that is fluidly coupled with a de-gasification collection tank 266 through an optional valve 118 that allows for collection of the carbon dioxide or other processing fluid (see Table 1 below). The de-gasification vessel 262 may also include a valve 118 that opens to the atmosphere, which allows for degassing into the atmosphere because carbon dioxide and some of the other substances are nontoxic. The de-gasification vessel 262 may optionally include heaters 132, coolers 134, thermocouples 136, pressure sensors 138, flow rate sensors 140, or other components, which can be operably coupled with the controller 150.

The fluid collection vessel 264 can receive the processed fluid for storage. The processed fluid can then be used for any purpose or provided to any other system. The fluid collection vessel 264 may be optional or omitted, such as when the fluid is provided into a different system or used immediately. For example, when the fluid is a liquid (e.g., juice), it can be stored until further processed or bottled. In another example, when the fluid is air, it can be provided to a heating, ventilation, and air conditioning (HVAC) system, processed through a high efficiency particulate absorber (HEPA) filters, or provided into a laboratory clean room or other facility that uses air that is free of viable pathogens.

The de-gasification collection tank 266 may be fluidly coupled with the gas reservoir 112 (e.g., carbon dioxide reservoir or other processing fluid) through an optional valve 118 and optional pressure source 116. The de-gasification collection tank 266 may also include a valve 118 that opens to the atmosphere, which allows for degassing into the atmosphere because carbon dioxide and some of the other substances are nontoxic. The de-gasification collection tank 266 can collect the gaseous carbon dioxide or other processing fluid and either release it into the atmosphere, or provide the carbon dioxide or other processing fluid to the gas reservoir 112, where the valve 118 and pressure source 116 can pressurize the carbon dioxide or other processing fluid into pressurized carbon dioxide or pressurized gas, such as being supercritical. This allows for recycling the carbon dioxide or other processing fluid through the pathogen control system 200 or otherwise.

It should be recognized that while only one heater 132, cooler 134, thermocouple 136, pressure sensor 138, and flow rate sensor 140 are shown in the graphene-coated chamber 201, depressurization vessel 260, and de-gasification vessel 262 are shown, any number can be included and in any locations. Also, it should be recognized that the gas reservoir 112, fluid reservoir 114, mixer 120 and/or any other component may include at least one heater 132, cooler 134, thermocouple 136, pressure sensor 138, and/or flow rate sensor 140. Also, any of these components can be operably coupled with the controller 150, whether wired or wirelessly. Accordingly, any of these components can have a transmitter, receiver or transceiver capable of data communication. Also, any of these components can include a processor or other computer component to allow for the operation thereof, such as the appropriate hardware, firmware, etc. for data communications and controlled operations. In an example, the controller 150 can be operably coupled to: at least one of an outlet valve 218 (e.g., adjustable valve) associated with at least one chamber outlet 122, at least one thermocouple 136, at least one pressure sensor 138, at least one flow rate sensor 140, at least one pressure source 116 associated with at least one chamber inlet 110, at least one mixer 120 operably coupled with at least one chamber inlet 110, at least one depressurization device (e.g., depressurization vessel 260) operably coupled with at least one chamber outlet 122, at least one de-gasification device (e.g., de-gasification vessel 262) operably coupled with at least one chamber outlet 122, at least one sonicator (e.g., mixing mechanism 124) operably coupled with the body 102, at least one vibrator (e.g., mixing mechanism 124) operably coupled with the body 102; at least one heater 132 thermally coupled with the internal chamber 106; or at least one cooler 134 thermally coupled with the internal chamber 106.

In an example, the one or more heater 132, cooler 134, thermocouple 136, pressure sensor 138, and flow rate sensor 140 may be located along the length of the internal chamber 106, depressurization vessel 260, and/or de-gasification vessel 262. Additional pressure sources 116 may also be included so as to be operably coupled with the internal chamber 106, depressurization vessel 260, and/or de-gasification vessel 262.

In one embodiment, a fluid processing system can include the pathogen control device (e.g., graphene-coated chamber) described herein, which when used for fluid processing may be referred to as a fluid processing device. The fluid processing system may also include at least one pressure source operably coupled with a chamber inlet of the internal chamber of the fluid processing device, and a depressurizing vessel operably coupled with a chamber outlet of the internal chamber of the fluid processing device. In one aspect, the fluid processing system can include a gas reservoir fluidly coupled with the at least one pressure source, and a fluid reservoir fluidly coupled with the at least one pressure source. In one aspect, the fluid processing system can include a mixing device fluidly coupled with the gas reservoir (e.g., carbon dioxide reservoir), fluid reservoir, and at least one pressure source. In one aspect, the fluid processing system can include a depressurizing vessel operably coupled with an outlet of the graphene-coated chamber. In one aspect, the fluid processing system can include a de-gasification vessel operably coupled with an outlet of the depressurizing vessel. In one aspect, the fluid processing system can include a de-gasification collection vessel operably coupled with a de-gasification outlet of the de-gasification vessel, and a fluid collection vessel operably coupled with a fluid outlet of the de-gasification vessel. In one aspect, the fluid processing system can include a de-gasification collection vessel operably coupled with a de-gasification outlet of the depressurization vessel or outlet of the de-gasification vessel, and a conduit extending between and fluidly coupling the de-gasification collection vessel to the gas reservoir. In one aspect, when pressurized carbon dioxide or other processing fluid is not used for fluid processing, the system may omit the gas reservoir (e.g., carbon dioxide reservoir), de-gasification vessel, and de-gasification collection vessel.

FIGS. 3A-C show various configurations of the body 102 of the graphene-coated chamber 201. FIG. 3A shows that the body 102 can be elongated so that the internal chamber 106 is linear and has a length dimension that is greater than the width dimension, and also shows a polygonal cross-sectional profile (e.g., square). Also, FIG. 3A shows that the chamber outlet 122 can have an outlet cross-sectional profile that is smaller than an internal cross-sectional profile of the internal chamber. The outlet cross-sectional profile may be defined by an outlet or by the adjustable valve 218.

FIG. 3B shows different examples of the body 102 that can be elongate and nonlinear with one or more bends.

FIG. 3C shows a body 102 that is elongate and coiled with valves 118 at each end. FIG. 3C also shows the body 102 being located within a housing 348, which may be a pressure resistant housing. The housing 348 may be a pressure vessel that is capable of withstanding high pressures, such as pressures at least as high as or higher than recited herein for retaining pressurized carbon dioxide or other processing fluid.

Figure 4A:
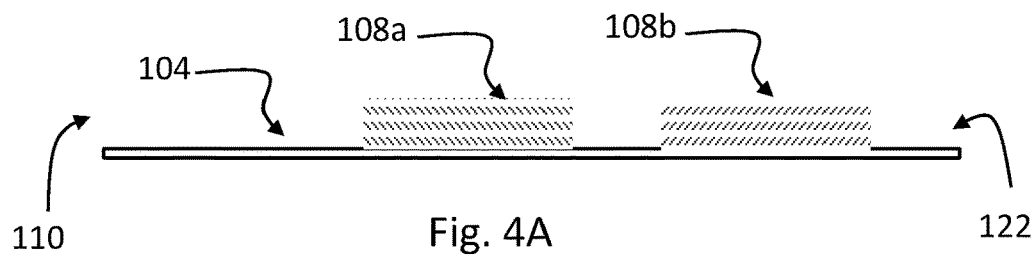
FIGS. 4A-4E illustrate embodiments of internal chambers of graphene-coated chambers.
Figure 4B:
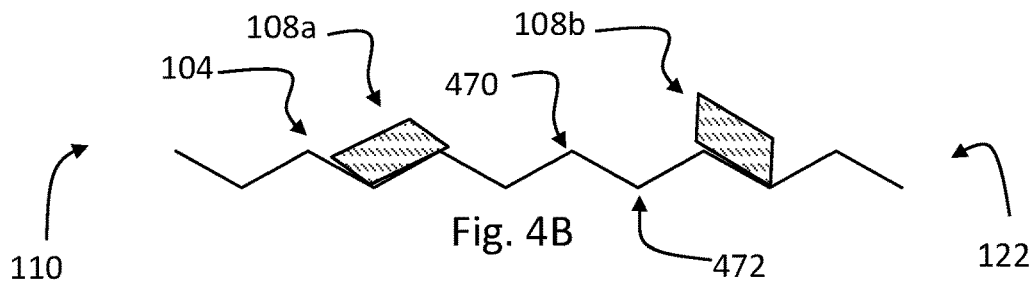

FIG. 4A shows that the internal wall 104 of the internal chamber 106 can be smooth, and the graphene layers 108a,b can be deposited in one or more regions on the internal wall 104. Graphene layer 108a is shown to have the graphene edges oriented toward the chamber inlet 110 and graphene layer 108b is shown to have the graphene edges oriented toward the chamber outlet 122. FIG. 4B shows that the internal wall 104 may be rough, such as by including a plurality of ridges 470, each ridge 470 separated by at least one trough 472. The ridges may be any form of roughness such as sand-blasting or etched variations in height and need not be orderly or regular. The graphene layers 108a,b may be located on the ridges 470 such as on a ridge face facing the chamber inlet 110 or a ridge face facing the chamber outlet 122.

However, it should be understood that the graphene or other two-dimensional material may be in any arrangement that is possible for that type of material, which may be in layers, jumbles, piles, or other ad-hoc deposition. Generally, the two-dimensional materials will be deposited or otherwise applied to the chamber internal walls by any manner, such as by chemical vapor deposition, or by adhering flakes or other formats of the two-dimensional materials.

Figure 4C:
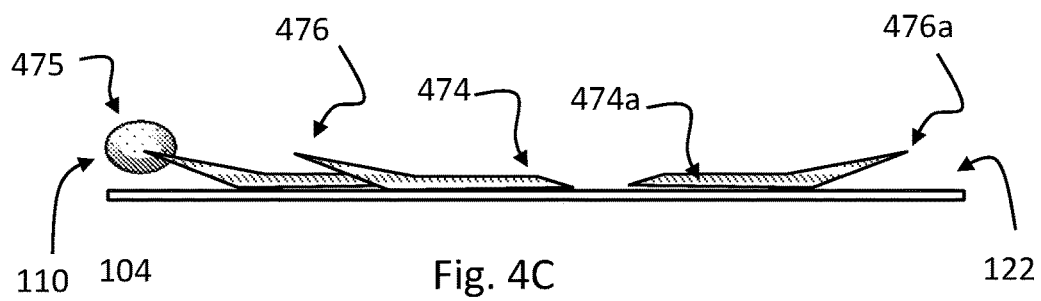

FIG. 4C shows a first graphene flake 474 having a first graphene edge 476 oriented toward the chamber inlet 110, and a second graphene flake 474a having a second graphene edge 476a oriented toward the chamber outlet 122. Also, FIG. 4C shows that the graphene edge 476 can be separated or lifted up from the surface of the internal wall 104, which provides the graphene edge 476 at some distance from the internal wall. The distance of separation from the graphene edge 476 from the internal wall can vary depending on the manufacturing of the graphene layer 108. For example, the graphene flake 474 can include at least one graphene edge 476 that is separated from the at least one internal wall 104 by at least about 1 nm, from about 1 nm to about 500 microns, or from about 10 nm to about 1 micron.

FIG. 4C also shows a pathogen 475, exemplified by a bacteria, perforated by an edge 476 of a graphene flake 474. The perforation in the pathogen 475 allows for the pressurized carbon dioxide or other processing fluid to rapidly enter into the pathogen 475 so that chemical reactions can occur with the carbon dioxide or other processing fluid to acidify the pathogen 475 to kill or deactivate the pathogen 475, or the other processing fluid may solubilize the pathogen or portions of the pathogen to control the pathogen. Accordingly, the pathogen 475 has one or more perforations in an outer layer extending into the pathogen, such as into the cytoplasm or viral envelope. When the processing includes the use of pressurized carbon dioxide or other processing fluid, the perforated pathogen also includes the pressurized carbon dioxide or other processing fluid in perforations and/or internally within the pathogen. Accordingly, in order to cause a perforation the at least one graphene edge is inserted at least partially into the pathogen.

Figure 4D:
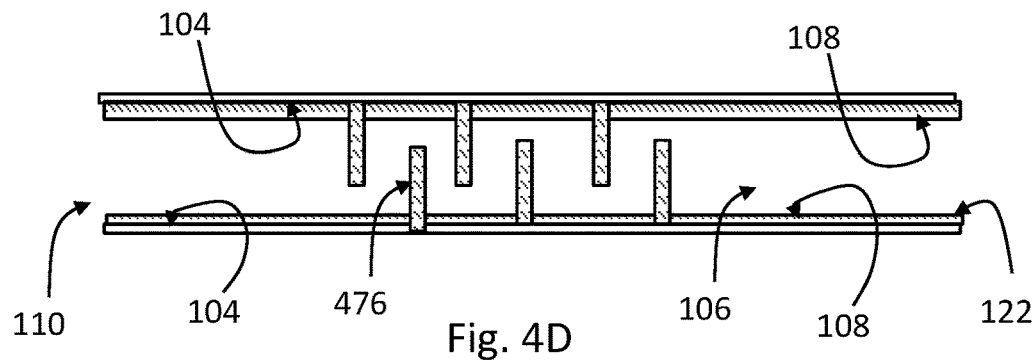

FIG. 4D shows that the internal chamber 106 can include one or more baffles 476 that disrupt the flow of the fluid and/or pressurized carbon dioxide or other processing fluid flowing therein. The baffles 476 can be present in any number, at any location, and in any pattern. As shown, baffles 476 are on opposite internal walls 104 to create a tortuous path through the internal chamber 106. The baffles 476 may be coupled to the internal walls 104, such as would be common in baffles 476 within a fluid passageway. The baffles 476 may also be coated with the graphene layer 108, and have the graphene flakes with the graphene edges, which can promote perforating the pathogens traversing the internal chamber 106.

Figure 4E:
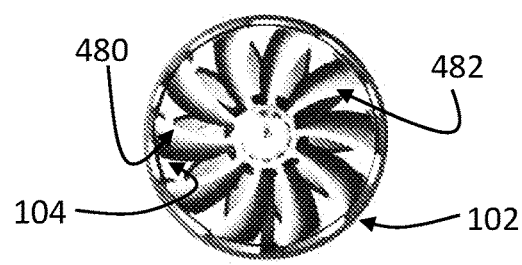

FIG. 4E shows a cyclonic baffle 480 that includes cyclonic baffle arms 482, which may be coupled with the internal wall 104. The cyclonic baffle 480 can cause the fluid flowing through the internal chamber 106 to be vortexed, mixed or otherwise caused to be turbulent to contact the graphene edges, which further causes more fluid and thereby more pathogens to contact the graphene edges. The cyclonic baffle arms 482 and other regions of the cyclonic baffle 480 may be coated with the graphene layer so as to have graphene flakes with graphene edges. The cyclonic baffle 480 may be considered a vortex device in that it causes the fluid to be vortexed within the internal chamber 106. The internal chamber 106 may include one or a plurality of cyclonic baffles 480. The cyclonic baffle 480 may be configured as or similar to a turbine air intake.

Figure 5A:
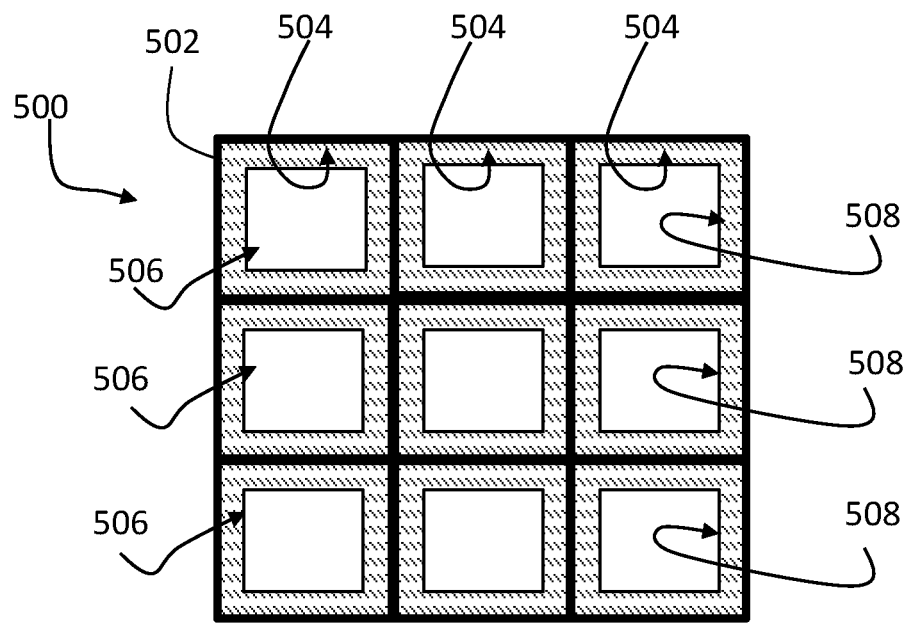
FIGS. 5A-5B illustrate embodiments of graphene-coated chambers having a plurality of separate internal chambers.

FIG. 5A shows a graphene-coated chamber 500 having a cross-sectional profile of a body 502 having a plurality of internal walls 504 defining a plurality of internal chambers 506. Each internal chamber 506 can include a graphene layer 508 located on at least a portion or fully covering the respective internal walls 504. The graphene layers 508 may include the graphene flakes having the graphene edges that protrude from the respective internal walls 504, such as described herein. The internal chambers 506 are shown to be arranged in a grid or array format so that one or more inlets fluidly coupled into the plurality of internal chambers 506, and which have one or more outlets. However, each internal chamber 506 may include its own inlet and outlet. In one example, a single inlet can be fluidly coupled with the plurality of internal chambers 506, and where the plurality of internal chambers 506 can be fluidly coupled to a single outlet. This allows for the surface area of the graphene layers 508 to be increased for a unit length in a graphene-coated chamber. Here, the body 502 may include all of the internal walls 504 that define the internal chambers 506, or the internal walls 504 may be separate members from an outer body 502.

Figure 5B:
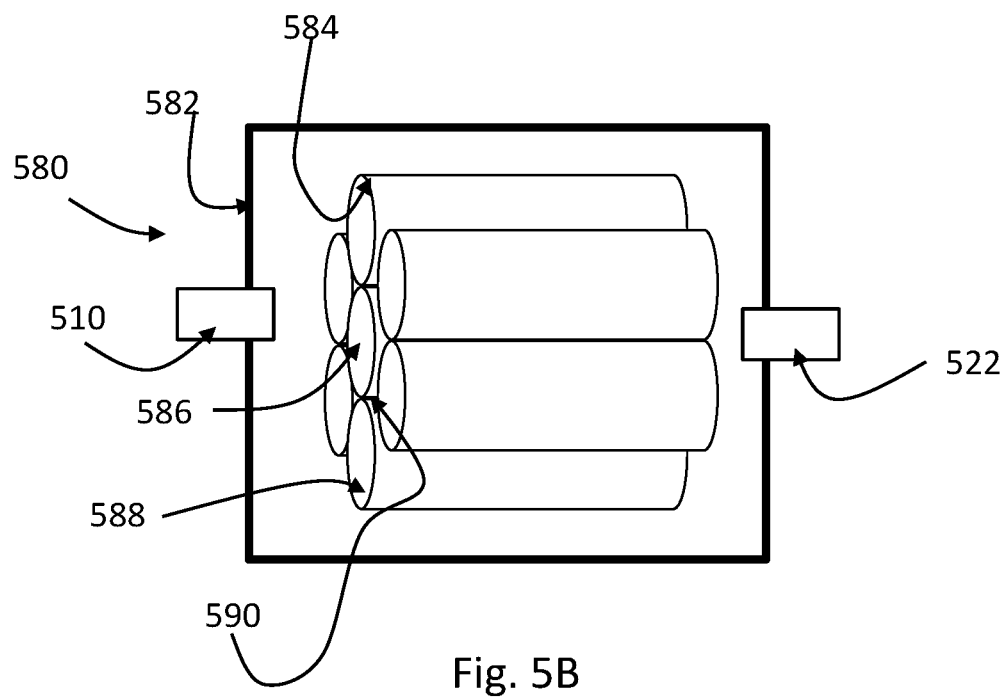

FIG. 5B shows a graphene-coated chamber 580 having a cross-sectional profile with a plurality of sub-internal walls 584 defining a plurality of sub-internal chambers 586. Each sub-internal chamber 586 can include a graphene layer 588 located on at least a portion or fully covering the respective sub-internal walls 584. The graphene layers 588 may include the graphene flakes having the graphene edges that protrude from the respective sub-internal walls 584, such as described herein. The sub-internal chambers 586 are shown to be arranged in a grid or array format so that one or more inlets 510 fluidly coupled into the plurality of sub-internal chambers 586, and which have one or more outlets 522. However, each sub-internal chamber 586 may include its own inlet and outlet. In one example, a single inlet 510 can be fluidly coupled with the plurality of internal chambers 506, and where the plurality of sub-internal chambers 586 can be fluidly coupled to a single outlet 522. This allows for the surface area of the graphene layers 588 to be increased for a unit length in a graphene-coated chamber 580. Here, the sub-internal walls 584 can include a plurality of pipes or tubes that are located within an optional housing 582. The interstitial spaces 590 between the tubular sub-internal walls 584 may be conduits or sub-internal chambers or filled so that the only flow paths are through the sub-internal chambers 586. This allows for the surface area of the graphene layers 588 to be increased for a unit length in a graphene-coated chamber.

The chamber can be defined by internal walls of any material. However, the chamber internal walls may have an outer layer of a material that can receive the graphene or other two-dimensional material thereon. The two-dimensional materials may be attached to the chamber internal walls by any manner or method, such as vapor deposition or adhering bodies or flakes of the two-dimensional material to the chamber internal wall. As such, the internal walls may be made of metals, ceramics, plastics, glass, or any other materials, and where an outer layer of the internal wall (e.g., layer exposed to internal chamber) has a material that can receive graphene or other two-dimensional material. When using adhesives, the outer layer of the internal wall that receives the graphene or other two-dimensional material may be formed from any material, such as metals, ceramics, plastics, glass, or any other materials. The graphene-coated chamber can include the chamber body and internal walls having at least the exposed surface prepared from a material that can receive the graphene layer thereon. In one aspect, when deposited by chemical vapor deposition or other method, the material can be selected from the group consisting of copper, stainless steel, nickel, ruthenium, iridium, germanium oxide, silicon, boron nitride, or combinations thereof. In one example, at least a layer of the internal wall having the graphene thereon can be copper. The graphene can be coated in one or more portions and/or with one or more graphene layers (e.g., containing graphene flakes with exposed or lifted graphene edges) by chemical vapor deposition techniques. For example, low pressure chemical vapor deposition can be used to apply the graphene to the chamber internal wall.

In one embodiment, the graphene may be deposited by being solubilized in ethanol, and then having the ethanol evaporated to leave the graphene. In another embodiment, the graphene can be grown on stainless steel by liquid phase chemical vapor deposition. In one embodiment, low pressure furnace growth can form spikey graphene on porous stainless steel.

The graphene-coated chamber can include one or more internal walls that define an internal cross-sectional profile. The internal cross-sectional profile can have a cross-dimension of between about 500 microns and 10 cm, between about 1 mm and 5 cm, between about 1 mm and 1 cm, or about 5 mm.

The graphene-coated chamber can include the internal chamber having a length that with the cross-sectional profile dimensions provides a sufficient volume for processing the fluid. The length can be determined in order to achieve a sufficient volume in view of the cross-sectional profile dimensions. It may be beneficial to have smaller cross-sectional profile dimensions to increase the probability of the pathogens to contact the graphene layer on the luminal wall of the internal chamber. As such, the volume may range from about 1 liter to about 100,000 kiloliters, from about 10 liters to about 100,000 liters, or have a volume less than about 10,000 liters, less than about 1,000 liters, less than about 500 liters, less than about 100 liters, or less than about 50 liters.

A pathogen control system can include the graphene-coated chamber of one of the embodiments. The pathogen control system may also include at least one pressure source operably coupled with an inlet of the internal chamber, and a depressurization vessel operably coupled with an outlet of the internal chamber. In one aspect, the pathogen control system may also include a housing with a housing chamber containing the graphene-coated chamber within the housing chamber. In one aspect, the housing is a pressure vessel. In one aspect, the pathogen control system may also include at least one adjustable valve at the at least one chamber outlet, wherein the at least one adjustable valve has an adjustable valve member for adjusting a cross-sectional dimension of a flow path through the at least one adjustable valve. In one aspect, at least one adjustable valve is operably coupled to a controller. In one aspect, the controller is a part of a computer or operable coupled to a computer.

In one embodiment, the pathogen control system can include various sensors. In one aspect, the sensors can include one or more thermocouples along a length of the internal chamber. The sensors may also include one or more pressure sensors along a length of the internal chamber. The sensors may also include one or more flow rate sensors along a length of the internal chamber.

In one embodiment, the pathogen control system can include a controller operably coupled to: at least one of an adjustable valve associated with at least one chamber outlet, at least one thermocouple, at least one pressure sensor, at least one flow rate sensor, at least one pressure source associated with at least one chamber inlet, at least one mixer operably coupled with at least one chamber inlet, at least one depressurization device operably coupled with at least one chamber outlet, at least one de-gasification device operably coupled with at least one chamber outlet, at least one sonicator operably coupled with the body, at least one vibrator operably coupled with the body; at least one heater thermally coupled with the internal chamber; or at least one cooler thermally coupled with the internal chamber. In one aspect, the controller is at least part of a computer or operable coupled to a computer.

In one embodiment, the fluid processing device can include the body having a plurality of internal walls defining a plurality of internal chambers. Each internal chamber can include a graphene layer on at least a portion of the respective internal wall. Each graphene layer can have at least one graphene flake with at least one graphene edge protruding from the respective internal wall.

In one embodiment, a fluid processing device can include a body having a plurality of sub-internal walls defining a plurality of sub-internal chambers, each sub-internal chamber comprising a graphene layer on at least a portion of the respective sub-internal wall, each graphene layer having at least one graphene flake with at least one graphene edge protruding from the respective sub-internal wall.

In one embodiment, a method of controlling pathogens can include providing the graphene-coated chamber of one of the embodiments, and flowing a fluid or a combination of a fluid and pressurized carbon dioxide or other processing fluid through the internal chamber. In one aspect, the fluid is flowed through the graphene-coated chamber until at least one pathogen is controlled.

In one embodiment, a method of processing a fluid can include providing the graphene-coated chamber of one of the embodiments, and flowing a fluid or a combination of a fluid and pressurized carbon dioxide or other processing fluid through the internal chamber.

In the methods described herein, the fluid can include at least one pathogen. As such, the method can include flowing the fluid or combination of the fluid and pressurized carbon dioxide or other processing fluid through the internal chamber until the at least one pathogen is controlled. In one aspect, the pathogen includes a microorganism. In one aspect, the pathogen is a parasite. In one aspect, the pathogen is a nematode. In one aspect, the microorganism is an amoeba, bacterium, virus, or fungi, wherein the fungi is in the form of spore, mycelium, or zygote. In one aspect, the method can include passing the pathogen over the at least one graphene flake until the pathogen has perforations in an outer layer extending into the pathogen, such as causing enough perforations that the pathogen is controlled. In one aspect, the method can include passing the pathogen through the internal chamber until the pathogen includes the pressurized carbon dioxide or other processing fluid in the perforations and/or internally within the pathogen. In one aspect, the method can include passing the pathogen over the at least one graphene flake until the at least one graphene edge is inserted at least partially into the pathogen. In one aspect, the method can include passing the pathogen through the internal chamber until the pathogen is controlled so as to be dead or deactivated so as to be incapable of reproducing.

In one embodiment, the method can include pressurizing the carbon dioxide. In one aspect, the method can include pressurizing the pressurized carbon dioxide to have a pressure less than about 30 MPa, between about 7.39 MPa to about 25 MPa, above about 3.45 MPa, or any other pressure recited herein or a pressure within a range recited herein. It is noted that the dense phase of carbon dioxide occurs below the critical point. In another aspect, the carbon dioxide may be replaced by another fluid (e.g., processing fluid), such as listed in Table 1, and may be pressured up to or above the supercritical pressure.

The method may also include maintaining the pressurized carbon dioxide or other processing fluid at a temperature, which may be any suitable temperature for the pressurized carbon dioxide, such as for being DPCD, sub-critical, or supercritical. The method may include heating the pressurized carbon dioxide or other processing fluid so as to have a temperature greater than about 29.85° C., between about 29.85° C. to about 100° C., or about 50° C., or any temperature recited herein or a temperature within a temperature range recited herein.

The method can include introducing the fluid into the internal chamber so that the fluid is exposed to the graphene. Any type of fluid may be used, which can be a liquid, such as a comestible liquid, where examples include water, a juice, or milk. The fluid may also be a gas, such as air.

In one embodiment, the method can include adjusting at least one adjustable valve at the at least one chamber outlet to adjust a cross-sectional dimension of a flow path through the at least one adjustable valve. The process for adjusting the adjustable valve may include causing a controller to operate the at least one adjustable valve, such as by the controller having computer executable instructions for performing the adjustment.

In one embodiment, the method can include causing a controller to implement the method steps described herein. In one aspect, the controller can cause the flow of the fluid or the combination of the fluid and pressurized carbon dioxide or other processing fluid through the internal chamber. In one aspect, the method can include controlling the flow rate of the fluid or combination of fluid and pressurized carbon dioxide or other processing fluid through the internal chamber.

In one embodiment, the method can include receiving a parameter regarding the flow rate of the fluid or combination of fluid and pressurized carbon dioxide or other processing fluid through the internal chamber into a controller. The method can also include controlling, with the controller, the flow rate of the fluid or combination of fluid and pressurized carbon dioxide or other processing fluid through the internal chamber.

In one embodiment, the method can include receiving a parameter regarding the pressure of the combination of fluid and pressurized carbon dioxide or other processing fluid through the internal chamber into a controller. The method may also include controlling, with the controller, the pressure of the fluid or combination of fluid and pressurized carbon dioxide or other processing fluid through the internal chamber.

In one embodiment, the method can include receiving a parameter regarding the temperature of the fluid or combination of fluid and pressurized carbon dioxide or other processing fluid at one or more locations through the internal chamber into a controller. The method may also include controlling, with the controller, the temperature of the fluid or combination of fluid and pressurized carbon dioxide or other processing fluid at one or more locations through the internal chamber.

In one embodiment, the method can include sonicating the fluid or combination of fluid and pressurized carbon dioxide or other processing fluid in the internal chamber with a sonicator. In one aspect, the method can include a controller providing the instructions to the sonicator to control the sonicating.

In one embodiment, the method can include vibrating the fluid or combination of fluid and pressurized carbon dioxide in the internal chamber with a vibrator. In one aspect, the method can include a controller providing instructions to the vibrator to control the vibrating.

In one embodiment, the graphene-coated chamber can be prepared by using chemical vapor deposition, such as low pressure chemical vapor deposition, to deposit the graphene layers on the surface of the chamber. The material of the chamber may be any that can receive graphene thereon, such as copper or others, such as those described herein or others. Graphene is highly surface mobile, which allows for the graphene to spread out through the length of the internal chamber and onto any baffles, bends, non-linearity, roughness, smoothness, or other features of the internal chamber. Once adhered, the graphene stays fixed. If graphene becomes detached from the internal wall of the chamber, the chemical nature results in conversion of the graphene into carbon dioxide. Accordingly, the processes described herein do not contaminate the fluid with graphene flakes or particulates. In one method, an outer material can be coated with a layer of the material (e.g., copper) that receives the graphene deposited directly thereon. This allows for the chamber to be formed of a first material that does not receive graphene, coating that first material with a second material that does receive graphene, and then depositing the graphene on the second material.

The technology described herein reduces the dwell time needed to process fluids by using the graphene-coated chamber to perforate the pathogens. The use of the graphene-coated chamber may also reduce the size of the chamber because the perforations allow for more pressurized carbon dioxide or other processing fluid (e.g., solvent gas) to enter into the pathogen at a faster rate. This allows for processing larger volumes of fluid with the use of the graphene-coated chamber than without the graphene coating. The technology allows the scale to vary, which can include scaling up to process many kiloliters of fluid per hour. The process can be modulated to result in a 3 log reduction, 6 log reduction, or 12 log reduction in pathogens in the fluid. In one example, at least 90% of the pathogens can be controlled.

The technology also allows for significantly reduced dwell times within the graphene-coated chamber. The dwell times may be as low as seconds or minutes, depending on the flow rate and chamber dimensions (e.g., diameter, width, and length) or any vortexing or turbulence within the flow.

The technology also does not result in the fluid or contents thereof being stuck to the graphene walls because the graphene flakes and edges only protrude on the nanometer or micron scale. However, such small protrusions of graphene edges feels smooth to the touch, and it is the microenvironment that allows the pathogens to be impaled by the graphene edges. The flow rate can be sufficient that any particles that are impaled by the graphene edges can be pushed down the chamber by the flow rate.

The flow rate and dimensions of the internal chamber (e.g., diameter or width and length) can determine the amount of fluid that can be processed per unit time. The graphene-coated chamber can be configured so that the dwell time is from 10 seconds to 10 minutes, or any dwell time therebetween.

The technology described herein can be used as a substitute for traditional pasteurization, or it may be considered a type of pasteurization. Pasteurization is a process of using heat and/or increased temperatures to kill pathogens, such as microbes (e.g., bacteria, fungi, etc.) in foods. Traditional pasteurization may be at temperatures at or above 100° C. (e.g., foods, such as soups, vegetables, juices, dairy products, jellies, jams, syrups, etc.), but may be at temperatures of 50-60° C. (e.g., for wine, milk, etc.). High pressure pasteurization of foods may be at pressures of 300-600 MPa, but at low temperatures such as room temperature. Now, pasteurization can be performed with the devices and systems described herein.

In one aspect, the carbon dioxide used as described herein may be replaced by another substances, such as another carbon-based substance. In one aspect, these substances may change the pH of the pathogen or act as a solvent for the pathogen and contents of the pathogen, thereby controlling the pathogen. The substances that may be used, such as supercritical fluids, are provided in Table 1. The "other processing fluid" other than carbon dioxide may include one or more substances listed in Table 1, which may include carbon dioxide and one or more additional substances as the "other processing fluid." The term "gas" in this specification is meant to refer to these materials whether they are gas, liquid, or supercritical or another phase that is neither gas nor liquid while in use or storage.

TABLE 1

| Substance | Molecular weight g/mol | Critical temperature K | Critical pressure MPa (atm) | Critical density g/cm$^3$ |
| --- | --- | --- | --- | --- |
| Carbon dioxide ($CO_2$) | 44.01 | 304.1 | 7.38 (72.8) | 0.469 |
| Water ($H_2O$) | 18.015 | 647.096 | 22.064 (217.755) | 0.322 |
| Methane ($CH_4$) | 16.04 | 190.4 | 4.60 (45.4) | 0.162 |
| Ethane ($C_2H_6$) | 30.07 | 305.3 | 4.87 (48.1) | 0.203 |
| Propane ($C_3H_8$) | 44.09 | 369.8 | 4.25 (41.9) | 0.217 |
| Ethylene ($C_2H_4$) | 28.05 | 282.4 | 5.04 (49.7) | 0.215 |
| Propylene ($C_3H_6$) | 42.08 | 364.9 | 4.60 (45.4) | 0.232 |
| Methanol ($CH_3OH$) | 32.04 | 512.6 | 8.09 (79.8) | 0.272 |
| Ethanol ($C_2H_5OH$) | 46.07 | 513.9 | 6.14 (60.6) | 0.276 |
| Acetone ($C_3H_6O$) | 58.08 | 508.1 | 4.70 (46.4) | 0.278 |
| Nitrous oxide ($N_2O$) | 44.013 | 306.57 | 7.35 (72.5) | 0.45 |

In some aspects, the devices and systems described for performing the methods can include a cooling system that be used to cool the sample before, during and after processing. The cooling system can include a controller that monitors the temperature at various locations (e.g., any locations), such as with thermocouples, and then actively adjust the temperature with cooling. In some aspects, the cooling can be at the inlet, throughout the conduit, and at the outlet of the conduit having the two dimensional material.

In some aspects, the cooling system can include an active cooler (e.g., chiller) that provides cooling to one or more of the components described herein. The active cooler can provide cooling at a mid-pressure carbon dioxide locations, cooling at high pressure carbon dioxide locations, and cooling at the outlet. The active cooler can provide cooling to a process chamber and sample input location. An outlet pressure heat exchanger can also be used, which may be associated with an output sample cooling device.

In some aspects, the outlet pressure heat exchanger can be used to inhibit freezing of the sample that is being processed through the conduit with the two dimensional material. The cooling system can actively cool the sample, and the outlet pressure heat exchanger can provide heat to control the temperature of the sample to inhibit freezing, which can be beneficial during depressurization. This can prevent freezing during decompression of the sample.

In some aspects, the cooling system can include a cooling bath, which can be cooled with chilled water. The conduit with the two-dimensional material may extend through the cooling bath, and any inlet conduits and outlet conduits may also be at least partially in the cooling bath. The cooling bath may be surrounded with insulation to maintain the lower temperature.

In some aspects, the pressurization system can be adapted to have highly compressed carbon dioxide. The pressurization system can compress the carbon dioxide, mix it with the sample (e.g., juice) to be processed in a controlled and measured protocol, processes the mixture through one or more chambers or conduits with the two-dimensional material, and then conduct a controlled pressure release.

For these and other processes and methods disclosed herein, the operations performed in the processes and methods may be implemented in differing order. Furthermore, the outlined operations are only provided as examples, and some operations may be optional, combined into fewer operations, eliminated, supplemented with further operations, or expanded into additional operations, without detracting from the essence of the disclosed embodiments.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. The terminology used herein is for the purpose of describing particular embodiments only, and is not intended to be limiting.

In one embodiment, the present methods can include aspects performed under control of a computing system. As such, the computing system can include a memory device that has the computer-executable instructions for performing the fluid processing methods. The computer-executable instructions can be part of a computer program product that includes one or more algorithms for performing any of the methods of any of the claims.

In one embodiment, any of the operations, processes, or methods, described herein can be performed or cause to be performed in response to execution of computer-readable instructions stored on a computer-readable medium and executable by one or more processors. The computer-readable instructions can be executed by a processor of a wide range of computing systems from desktop computing systems, portable computing systems, tablet computing systems, hand-held computing systems, as well as network elements, and/or any other computing device. The computer readable medium is tangible and not transitory. The computer readable medium is a physical medium having the computer-readable instructions stored therein so as to be physically readable from the physical medium by the computer/processor.

There are various vehicles by which processes and/or systems and/or other technologies described herein can be effected (e.g., hardware, software, and/or firmware), and that the preferred vehicle may vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The various operations described herein can be implemented, individually and/or collectively, by a wide range of hardware, software, firmware, or virtually any combination thereof. In one embodiment, several portions of the subject matter described herein may be implemented via application specific integrated circuits (ASICs), field programmable gate arrays (FPGAs), digital signal processors (DSPs), or other integrated formats. However, some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware are possible in light of this disclosure. In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a physical signal bearing medium include, but are not limited to, the following: a recordable type medium such as a floppy disk, a hard disk drive (HDD), a compact disc (CD), a digital versatile disc (DVD), a digital tape, a computer memory, or any other physical medium that is not transitory or a transmission. Examples of physical media having computer-readable instructions omit transitory or transmission type media such as a digital and/or an analog communication medium (e.g., a fiber optic cable, a waveguide, a wired communication link, a wireless communication link, etc.).

It is common to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. A typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems, including feedback loops and control motors (e.g., feedback for sensing position and/or velocity; control motors for moving and/or adjusting components and/or quantities). A typical data processing system may be implemented utilizing any suitable commercially available components, such as those generally found in data computing/communication and/or network computing/communication systems.

The herein described subject matter sometimes illustrates different components contained within, or connected with, different other components. Such depicted architectures are merely exemplary, and that in fact, many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include, but are not limited to: physically mateable and/or physically interacting components and/or wirelessly interactable and/or wirelessly interacting components and/or logically interacting and/or logically interactable components.

FIG. 6 shows an example computing device 600 (e.g., a computer) that may be arranged in some embodiments to perform the methods (or portions thereof) described herein. In a very basic configuration 602, computing device 600 generally includes one or more processors 604 and a system memory 606. A memory bus 608 may be used for communicating between processor 604 and system memory 606.

Depending on the desired configuration, processor 604 may be of any type including, but not limited to: a microprocessor (μP), a microcontroller (μC), a digital signal processor (DSP), or any combination thereof. Processor 604 may include one or more levels of caching, such as a level one cache 610 and a level two cache 612, a processor core 614, and registers 616. An example processor core 614 may include an arithmetic logic unit (ALU), a floating point unit (FPU), a digital signal processing core (DSP Core), or any combination thereof. An example memory controller 618 may also be used with processor 604, or in some implementations, memory controller 618 may be an internal part of processor 604.

Depending on the desired configuration, system memory 606 may be of any type including, but not limited to: volatile memory (such as RAM), non-volatile memory (such as ROM, flash memory, etc.), or any combination thereof. System memory 606 may include an operating system 620, one or more applications 622, and program data 624. Application 622 may include a determination application 626 that is arranged to perform the operations as described herein, including those described with respect to methods described herein. The determination application 626 can obtain data, such as pressure, flow rate, and/or temperature, and then determine a change to the system to change the pressure, flow rate, and/or temperature.

Computing device 600 may have additional features or functionality, and additional interfaces to facilitate communications between basic configuration 602 and any required devices and interfaces. For example, a bus/interface controller 630 may be used to facilitate communications between basic configuration 602 and one or more data storage devices 632 via a storage interface bus 634. Data storage devices 632 may be removable storage devices 636, non-removable storage devices 638, or a combination thereof. Examples of removable storage and non-removable storage devices include: magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include: volatile and non-volatile, removable and non-removable media implemented in any method or technology for storage of information, such as computer readable instructions, data structures, program modules, or other data.

System memory 606, removable storage devices 636 and non-removable storage devices 638 are examples of computer storage media. Computer storage media includes, but is not limited to: RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of computing device 600.

Computing device 600 may also include an interface bus 640 for facilitating communication from various interface devices (e.g., output devices 642, peripheral interfaces 644, and communication devices 646) to basic configuration 602 via bus/interface controller 630. Example output devices 642 include a graphics processing unit 648 and an audio processing unit 650, which may be configured to communicate to various external devices such as a display or speakers via one or more A/V ports 652. Example peripheral interfaces 644 include a serial interface controller 654 or a parallel interface controller 656, which may be configured to communicate with external devices such as input devices (e.g., keyboard, mouse, pen, voice input device, touch input device, etc.) or other peripheral devices (e.g., printer, scanner, etc.) via one or more I/O ports 658. An example communication device 646 includes a network controller 660, which may be arranged to facilitate communications with one or more other computing devices 662 over a network communication link via one or more communication ports 664.

The network communication link may be one example of a communication media. Communication media may generally be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR), and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 600 may also be implemented as a personal computer including both laptop computer and non-laptop computer configurations. The computing device 600 can also be any type of network computing device. The computing device 600 can also be an automated system as described herein.

The embodiments described herein may include the use of a special purpose or general-purpose computer including various computer hardware or software modules.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device comprising:

a body having a first end and a second end with at least one internal wall disposed between the first end and the second end, the at least one internal wall being formed of a first material to define a closed internal chamber having a interior configured to retain a fluid;

an inlet provided at the first and end in fluid communication with the internal chamber;

at least one pressure source in fluid communication with the inlet and configured to move material through the inlet into the internal chamber;

at least one layer of a two-dimensional material on at least a portion of the at least one internal wall, wherein the at least one layer of the two-dimensional material has at least one edge that protrudes from the at least one internal wall inwardly toward the interior of the internal chamber, wherein the first material is different from the two dimensional material.

2. The device of claim 1, further comprising pressurized carbon dioxide or processing fluid in the internal chamber.

3. The device of claim 2, further comprising a fluid in the internal chamber with the pressurized carbon dioxide or processing fluid.

4. The device of claim 1, further comprising a pathogen in the internal chamber.

5. The device of claim 4, wherein the pathogen is selected from the group of a microorganism, parasite, nematode, bacterium, amoeba, fungi, virus, or combinations thereof.

6. The device of claim 1, further comprising a comestible liquid in the internal chamber.

7. The device of claim 6, wherein the comestible liquid is selected from the group of a juice, milk, or combination thereof.

8. The device of claim 1, wherein the at least one layer of the two dimensional material includes at least one layer of graphene, graphene-oxide dichalcogenides, xenes, boron nitride, stanine, or combinations thereof.

9. The device of claim 1, wherein the at least one edge of the at least one layer of the two-dimensional material points toward at least one of the inlet or a chamber outlet of the internal chamber.

10. The device of claim 1, further comprising at least one vortex device within the internal chamber.

11. The device of claim 1, further comprising at least one adjustable valve located in at least one chamber outlet of the internal chamber, the at least one adjustable valve has an adjustable valve member configured to adjust a cross-sectional dimension of a flow path through the at least one adjustable valve.

12. The device of claim 1, further comprising a controller operably coupled to:

at least one of an adjustable valve coupled with at least one chamber outlet of the internal chamber, at least one thermocouple located in the internal chamber;

at least one pressure sensor located in the internal chamber; at least one flow rate sensor located the internal chamber;

at least one pressure source coupled with at least one chamber inlet;

at least one mixer operably coupled with at least one chamber inlet;

at least one depressurization device operably coupled with at least one chamber outlet;

at least one de-gasification device operably coupled with at least one chamber outlet;

at least one sonicator operably coupled with the body;

at least one vibrator operably coupled with the body;

at least one heater thermally coupled with the internal chamber; or at least one cooler thermally coupled with the internal chamber.

13. The device of claim 1, further comprising a depressurizing vessel operably coupled with a chamber outlet of the internal chamber.

14. The device of claim 13, comprising a gas reservoir fluidly coupled with the at least one pressure source; and a fluid reservoir fluidly coupled with the at least one pressure source.

15. The device of claim 13, comprising a de-gasification vessel operably coupled with an outlet of the depressurizing vessel.

16. The device of claim 1, comprising the body having a plurality of internal walls that define a plurality of closed internal chambers, each internal chamber having an interior and at least one layer of the two-dimensional material on at least a portion of the respective internal wall, each layer of the two-dimensional material has at least one flake with at least one edge that protrudes from the respective internal wall inwardly toward the interior.

17. The device of claim 1, the internal chamber containing a plurality of sub-internal walls that define a plurality of closed sub-internal chambers, each sub-internal chamber having an interior and layer of the two-dimensional material on at least a portion of the respective sub-internal wall, each layer of the two- dimensional material has at least one flake with at least one edge that protrudes from the respective sub-internal wall inwardly toward the interior.

* * * * *